United States Patent [19]

Higuchi et al.

[11] Patent Number: 4,481,609

[45] Date of Patent: Nov. 6, 1984

[54] SEMICONDUCTOR MEMORY MINIATURIZED BY LINE GROUPS AND STAGGERED CELLS

[75] Inventors: Mitsuo Higuchi, Tokyo; Atsushi Takeuchi, Yokohama, both of Japan

[73] Assignee: Fujitsu Limited, Kawasaki, Japan

[21] Appl. No.: 409,404

[22] Filed: Aug. 19, 1982

[30] Foreign Application Priority Data

Aug. 19, 1981 [JP] Japan ................. 56-128803

[51] Int. Cl.³ .................. G11C 5/02; G11C 5/06
[52] U.S. Cl. ..................... 365/72; 365/230; 365/51
[58] Field of Search .......... 365/72, 230, 63, 51

[56] References Cited

U.S. PATENT DOCUMENTS 3,484,767 12/1969 Matthews .................. 365/230

FOREIGN PATENT DOCUMENTS 0031490 7/1981 European Pat. Off. ........... 365/51
1379185 4/1973 United Kingdom ............. 365/230
2031241 4/1980 United Kingdom ............. 365/230

Primary Examiner—Stuart N. Hecker
Assistant Examiner—Glenn Gossage
Attorney, Agent, or Firm—Staas & Halsey

[57] ABSTRACT

A semiconductor memory device wherein each word-line selecting and driving circuit output is connected to a set of plural adjacent word lines and a plurality of memory cells are arranged between one of the adjacent word lines in one set and one of bit lines. By connecting a set of plural adjacent word lines to each word-line selecting and driving circuit the interval between adjacent bit lines, the interval between adjacent word lines, the size of the memory cell array, and therefore the size of the semiconductor memory device can be reduced.

14 Claims, 8 Drawing Figures

SEMICONDUCTOR MEMORY MINIATURIZED BY LINE GROUPS AND STAGGERED CELLS

BACKGROUND OF THE INVENTION

1. Field of the Invention

The present invention relates to a semiconductor memory device.

Generally, a semiconductor memory device comprises a word-line selecting and driving circuit (word drive circuit) for decoding word address signals to select a single word line and for driving the selected single word line, a bit-line selecting circuit for decoding bit address signals, a plurality of word lines connected to the outputs of the word-drive circuit, a plurality of bit lines connected to the outputs of the bit-line selecting circuit, and memory cells arranged on the intersections between the word lines and the bit lines.

The present invention more particularly relates to a semiconductor memory device in which the memory cell array can be miniaturized without limitation by the space occupied by the word drive circuit.

2. Description of the Prior Art

Conventionally, the outputs of a word drive circuit are connected to the word lines in a one-to-one correspondence. Recent miniaturization of memory cells has led to an increasingly smaller space between adjacent word lines; however, this has made essential the miniaturization of the word drive circuit which is integrated with the memory cell array on one chip. Miniaturization of word drive circuits, however, is difficult.

As a result, the size of the word drive circuits has limited the degree to which memory cell arrays could be miniaturized. This has been especially true in an erasable programmable read only memory (EPROM) which has a complicated word drive circuit including high voltage driving circuits as well as row decoder circuits. Therefore, in conventional semiconductor memory devices, although the size of the memory cell arrays themselves could theoretically be miniaturized, the degree of their miniaturization has been limited by the size of the word drive circuits. As a result, the total size of semiconductor memory devices could not be miniaturized to the desired extent.

To achieve some miniaturization of semiconductor memory devices, one known system has had the word drive circuits arranged on both sides of the memory cell arrays. While this system does allow the memory cell arrays to be miniaturized, it doubles the area occupied by the word drive circuits compared with a system where the word drive circuits are arranged on only one side of the memory cell array. Therefore, this known system runs counter in principle to the miniaturization of the entire semiconductor memory device.

SUMMARY OF THE INVENTION

Accordingly, a primary object of the present invention is to provide a semiconductor memory device in which a memory cell array can be miniaturized without limitation by the word drive circuit.

Another object of the present invention is to provide a semiconductor memory device in which a memory cell array can be miniaturized without requiring additional word drive circuits.

In order to achieve the above objects, there is provided, according to the invention, a semiconductor memory device comprising: a plurality of word lines; a plurality of bit lines cross coupled with said word lines; a word-line selecting and driving circuit having inputs operatively receiving word address signals, said word-line selecting and driving circuit operatively decoding said word address signals and selectively driving the word lines; a bit-line selecting circuit having inputs operatively receiving bit address signals, said bit-line selecting circuit operatively decoding said bit address signals and selecting one of said bit lines; a plurality of memory cells arranged at corresponding intersections between said word lines and said bit lines; further, the word-line selecting and driving circuit having outputs each of which is commonly connected to a set of plural adjacent word lines; and the memory cells are arranged only at intersections between one of the adjacent word lines in each one of the sets and one of the bit lines, and between another of the adjacent word lines in said each of the sets and another of the bit lines.

BRIEF DESCRIPTION OF THE DRAWINGS

The above objects and features as well as other features and advantages of the present invention will be more apparent when read in conjunction with the accompanying drawings, wherein.

DESCRIPTION OF THE PREFERRED EMBODIMENTS

Embodiments of the present invention will now be described in comparison with conventional technology and with reference to the accompanying drawings.

Figure 1:
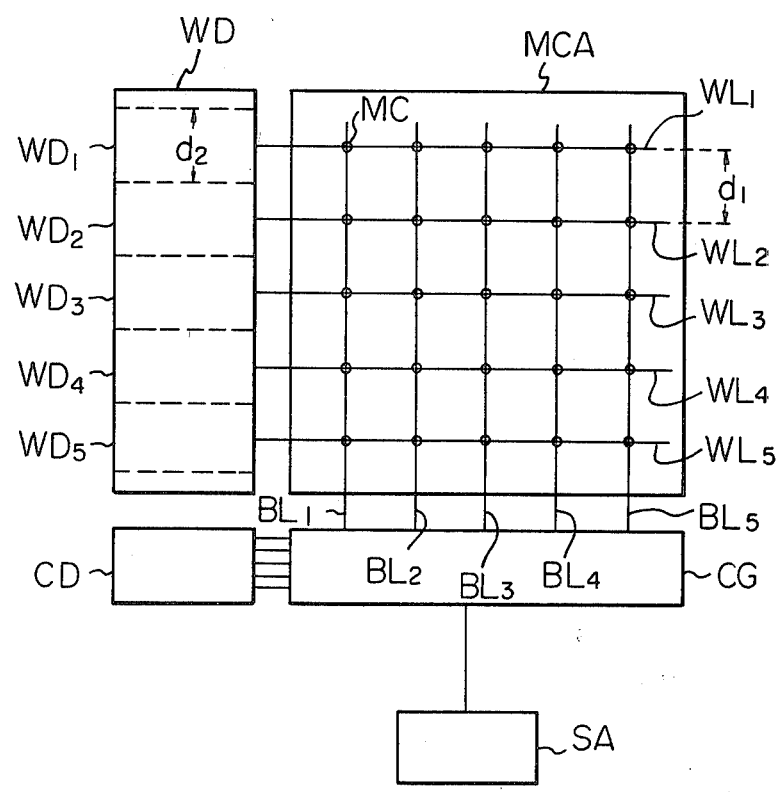
FIG. 1 is a block diagram of an example of a conventional semiconductor memory device.

In FIG. 1, a conventional semiconductor memory device comprises a memory cell array MCA on which word lines $WL_1$ through $WL_5$ and bit lines $BL_1$ through $BL_5$ intersect each other. A memory cell MC is arranged at the intersection of each word line and bit line. The word lines $WL_1$ through $WL_5$ are connected, in a one-to-one correspondence, to the outputs of a word drive circuit WD including word drive units $WD_1$ through $WD_5$, respectively. The bit lines $BL_1$ through $BL_5$ are connected through a column gate CG to a sense amplifier SA. CD is a column decoder with outputs connected to the column gate CG. The column decoder CD and the column gate CG constitute a bit-line selecting circuit.

The miniaturization of memory cells due to recent developments in semiconductor technology has led to increasingly smaller intervals $d_1$ between adjacent word lines. Since each word drive unit has a complicated circuit structure, however, the width $d_2$ of each word drive unit cannot be made as small as the smaller interval $d_1$. Since the word drive units $WD_1$ through $WD_5$ are integrated with the memory cell array on one chip, it is not practical to make the interval $d_1$ between word lines smaller than the width $d_2$ of each word drive unit. This is because it would complicate the wiring patterns for which connect the word drive units $WD_1$ through $WD_5$ and the word lines $WL_1$ through $WL_5$. Thus, in the conventional device of FIG. 1, the miniaturization of a memory cell array is restricted by the width $d_2$ of the word drive unit.

Figure 2:
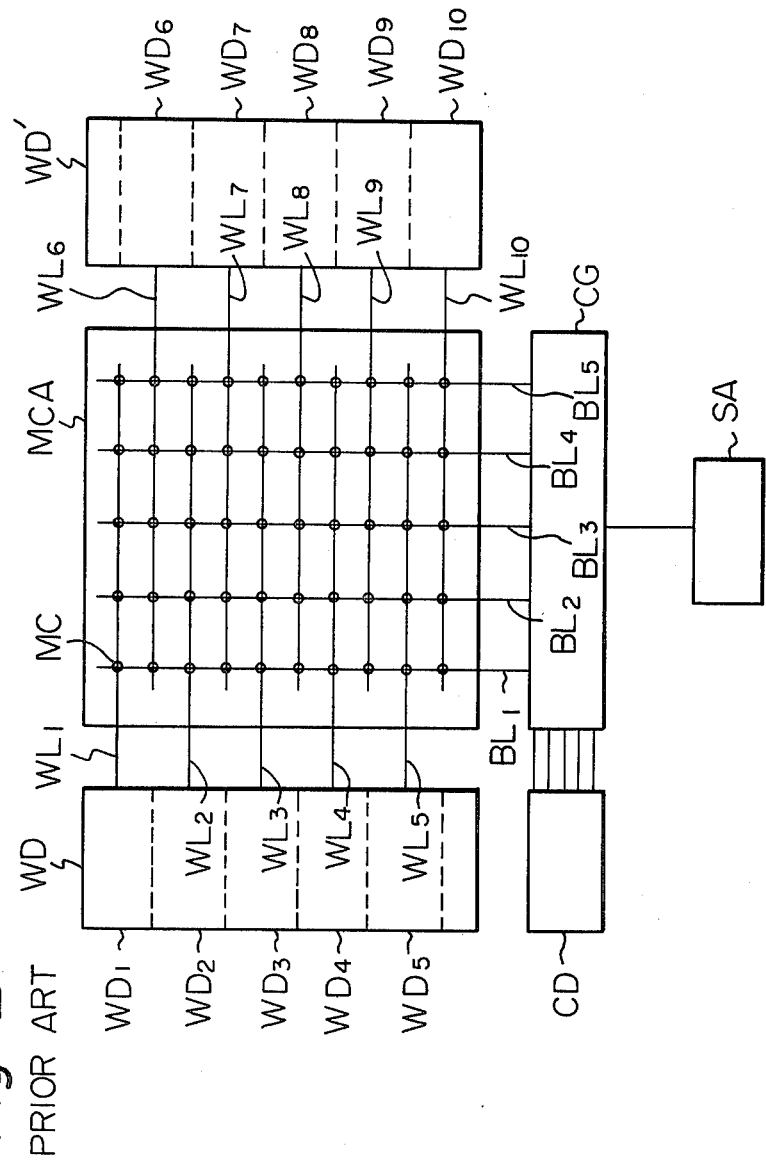
FIG. 2 is a block diagram of another example of a conventional semiconductor memory device.

In FIG. 2, another example of a conventional semiconductor memory device is illustrated. The main difference between FIG. 1 and FIG. 2 is that, in FIG. 2 an additional word drive circuit WD', including word drive units $WD_6$ through $WD_{10}$ is arranged on the side of memory cell array MCA opposite to word drive circuit WD including word drive units $WD_1$ through $WD_5$. The outputs of the word drive units $WD_6$ through $WD_{10}$ are connected to additional word lines $WL_6$ through $WL_{10}$. Each of the additional word lines $WL_6$ through $WL_{10}$ extends between two adjacent word lines of the word lines $WL_1$ through $WL_5$. A memory cell MC is arranged on the intersection between each word line of the word lines $WL_1$ through $WL_{10}$ and each bit line of the bit lines $BL_1$ through $BL_5$. The circuit configuration of FIG. 2 is the same as that of FIG. 1 except for the above. The provision of word drive units on both sides of the memory cell array doubles the integration degree of the memory cell array in FIG. 2 over that of FIG. 1. However, it also doubles the area occupied by the word drive units over that of FIG. 1. Therefore, the conventional device of FIG. 2 runs counter in principle to the miniaturization of semiconductor memory devices.

Figure 3:
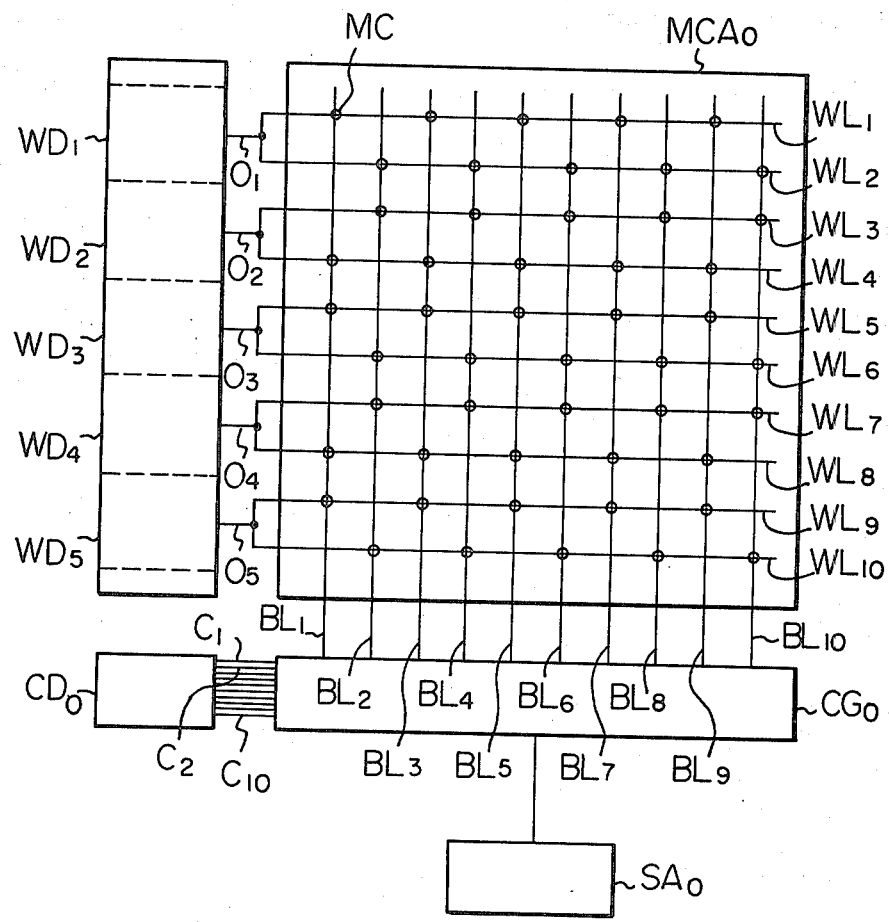
FIG. 3 is a block diagram of a semiconductor memory device, according to an embodiment of the present invention.

An embodiment of the present invention will now be described with reference to FIG. 3. This embodiment is realized by an EPROM. In FIG. 3 each output, $O_1$ through $O_5$, of the word drive units $WD_1$ through $WD_5$ is commonly connected to a pair of adjacent word lines $(WL_1, WL_2)$, $(WL_3, WL_4)$, $(WL_5, WL_6)$, $(WL_7, WL_8)$, and $(WL_9, WL_{10})$, respectively. Between each of the bit lines $BL_1$ through $BL_{10}$ and one of two word lines in each of the pairs $(WL_1, WL_2)$ through $(WL_9, WL_{10})$, a memory cell MC is arranged. That is, between each of the bit lines $BL_1$, $BL_3$, $BL_5$, $BL_7$, and $BL_9$ and each of the word lines $WL_1$, $WL_4$, $WL_5$, $WL_8$, and $WL_9$, a memory cell MC is arranged. Also, between each of the bit lines $BL_2$, $BL_4$, $BL_6$, $BL_8$, and $BL_{10}$ and each of the word lines $WL_2$, $WL_3$, $WL_6$, $WL_7$, and $WL_{10}$, another memory cell MC is arranged. The bit lines $BL_1$ through $BL_{10}$ are connected to ten outputs of a column gate $CG_0$. Ten inputs of the column gate $CG_0$ are connected to ten outputs $C_1$, $C_2$, ... of a column decoder $CD_0$. The column gate $CG_0$ is connected to a sense amplifier $SA_0$.

In operation, the word drive units receive word address signals and decode them to drive one of the five outputs $O_1$ through $O_5$, while the column decoder $CD_0$ receives bit address signals, decodes them and selects one of the outputs $C_1$ through $C_{10}$ *l to be a high potential. The selected one of the ouputs* $C_1$ through $C_{10}$ is applied to the corresponding gate transistor (not shown in FIG. 3) in the column gate $CG_0$ to open the gate transistor. Thus, the memory cell arranged between the driven word line and the selected bit line is selected for writing or reading.

In the wiring pattern of FIG. 3, the size of the memory cell array $MCA_0$ is the same as the size of the array MCA in FIG. 1 or FIG. 2. On the other hand, there are twice the number of word lines, bit lines, and memory cells as in FIG. 1. Therefore, the integration degree of the memory cell array $MCA_0$ in FIG. 3 is twice as that of the conventional array MCA in FIG. 1. It should be noted that the word drive units $WD_1$ through $WD_5$ are the same as those in the conventional example of FIG. 1. No additional word drive circuit is provided in FIG. 3.

It will be noted that the space between two adjacent bit lines in FIG. 3 is half that of FIG. 1. Since column gates are not as complex a word drive circuits and since the memory cells connected to one word line are connected to alternate bit lines, reducing the space between adjacent bit lines is not a problem. The word drive unit $WD_1$ comprises a row decoder, an output buffer and a high voltage driving circuit. The word drive unit $WD_2$ comprises a row decoder, an output buffer, and a high voltage driving circuit. Each of these circuits in the word drive units is well known. Briefly, when all of the address signals are "0", the output of the first row decoder is selected. When the word address signals are 1000 ... 0, the output of the second row decoder is selected.

The output buffer or word drive unit WD, or $WD_2$ receives an inverted power down signal. When the memory device is in a standby state, the power down signal is at a high potential and the inverted power down signal is at a low potential so that the output buffers of both word drive units, $WD_1$ and $WD_2$, are inactive.

The high voltage driving circuits supply the high voltages necessary to effect writing into the memory cells MC of the EPROM (PROM erasable by means of ultraviolet rays). When the output of the row decoder of unit $WD_1$ is selected to be a high potential (H level), the output buffer thereof outputs the H level. Therefore, the high voltage is applied to the output $O_1$ of the word drive unit $WD_1$. With respect to the remaining nonselected word drive circuits, for example, the word drive unit $WD_2$, since the output buffer thereof outputs a low potential (L level), the output $O_2$ becomes the L level. During reading, the writing signal is not applied to the high voltage driving circuits, so that the high voltage $V_{pp}$ is not applied to the memory cells MC. No further detailed description is provided here because the components of the word drive units $WD_1$, $WD_2$, ... are well known.

The memory cell array $MCA_0$ comprises memory cells MC. Each memory cell MC is a FAMOS with stored contents erasable by radiating ultraviolet rays. Each FAMOS has a control gate connected to a word line, a floating gate provided under the control gate and for storing information, a drain connected to a bit line, and a source connected to a ground. Each bit line is connected through a metal oxide semiconductor (MOS) transistor in the column gate $CG_0$ to the sense amplifier $SA_0$. The output signals $C_1$, $C_2$, $C_3$, ... of the column decoder $CD_0$ are applied to the gates of the MOS transistors in the column gate $CG_0$.

The output $O_1$ of the word drive unit $WD_1$ is commonly connected, in this embodiment, to two word lines $WL_1$ and $WL_2$. The output $O_2$ is similarly commonly connected to two word lines $WL_3$ and $WL_4$.

Figure 4:
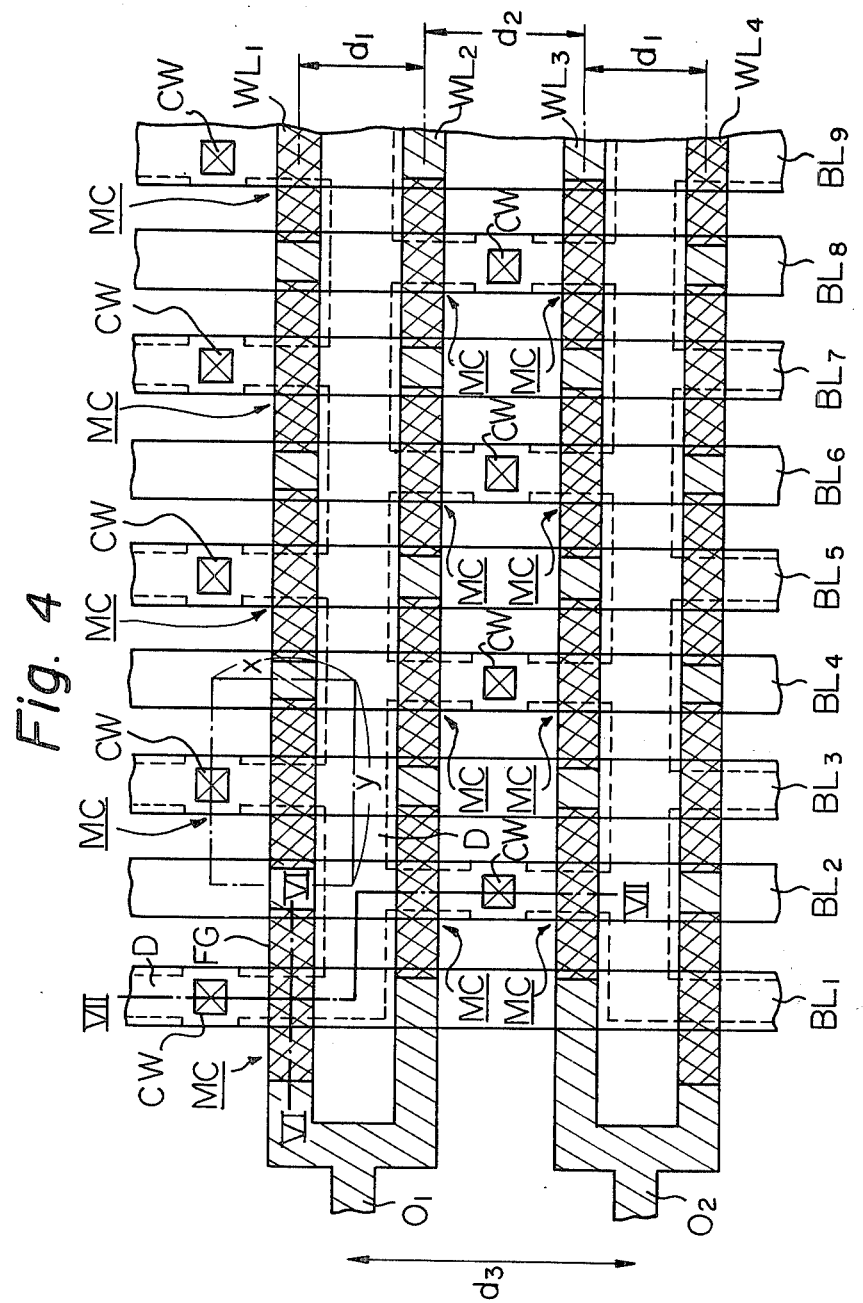
FIG. 4 is a plan view of a pattern arrangement of a part of the memory cell array in the device of FIG. 3.

FIG. 4 is a plan view illustrating a pattern arrangement of a part of the memory cell array in the device of FIG. 3. In FIG. 4, the word lines $WL_1$ and $WL_2$ extend in parallel, spaced apart at an interval $d_1$. At one end, the word lines $WL_1$ and $WL_2$ are connected to the output $O_1$ of the word drive unit $WD_1$ (FIG. 3). Similarly, the word lines $WL_3$ and $WL_4$ extend in parallel, spaced apart at the interval $d_1$, and are connected at one end to the output $O_2$ of the word drive unit $WD_2$. The interval between the word lines $WL_2$ and $WL_3$ is represented by $d_2$, which is greater than $d_1$ because of the presence of contact windows CW. The bit lines $BL_1$, $BL_2$, . . . are arranged so as to be perpendicular to the extending direction of the word lines. Each memory cell MC, which is a well known FAMOS, is arranged on an intersecting portion of a word line and a bit line. The contact windows CW are for connecting the bit lines to diffusion regions D.

Figure 5:
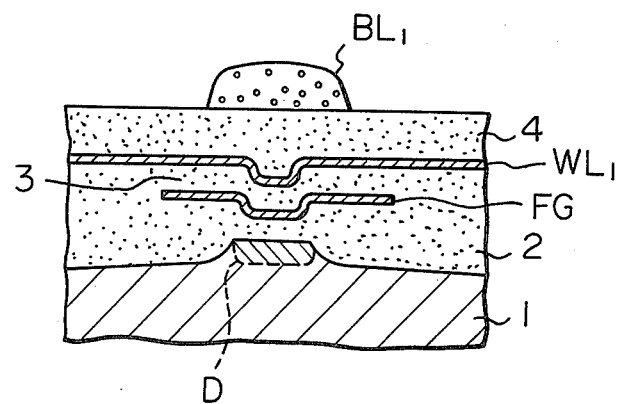
FIG. 5 is a cross-sectional view taken along line VI—VI of FIG. 4, of a physical structure of a floating gate avalanche injection metal oxide semiconductor (FAMOS)
Figure 6:
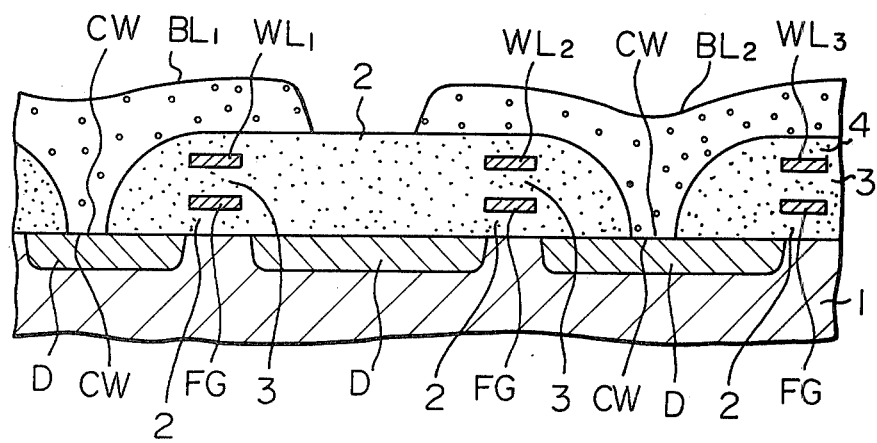
FIG. 6 is an expanded cross-sectional view taken along line VII—VII of FIG. 4, of a physical structure of the FAMOS.

The physical structure of an FAMOS is illustrated in FIG. 5, which is a cross-sectional view taken along line VI—VI of FIG. 4. The physical structure of two or more FAMOS is illustrated in FIG. 6, which is a cross-sectional view taken along line VII—VII of FIG. 4. Referring to FIGS. 4, 5, and 6, on a semiconductor substrate 1, a first insulating layer 2 is formed. On the first insulating layer 2, floating gates FG are formed, and covered by a second insulating layer 3 formed thereon. The word lines $WL_1$, $WL_2$, $WL_3$, . . . are formed on the layer 3 extending above and spaced thereby from the floating gates FG. The bit lines $BL_1$, $BL_2$, . . . are formed on the third insulating layer 4 and spaced thereby from the floating gates FG. The word lines $WL_1$, $WL_2$, . . . are formed of polycrystalline silicon and act as control gates. The bit lines $BL_1$, $BL_2$, . . . are formed of aluminum and are in contact with diffusion regions D. The diffusion regions D are formed by a self-alignment technique after forming the floating gates FG and the word lines (control gates) $WL_1$ and, therefore, are not present under the floating gates FG. The broken line in FIG. 5 indicates that the diffusion region D is not actually under the floating gate FG but is rather to its front or rear. It will be understood from FIGS. 4 and 6 that the bit lines $BL_1$, $BL_2$, . . . are in contact with the diffusion regions D at the contact windows CW.

As illustrated in FIG. 4, the interval between the two adjacent outputs $O_1$ and $O_2$ of the word drive circuits $WD_1$ and $WD_2$ is represented by $d_3$. The relation among the intervals $d_1$, $d_2$, and $d_3$ is $d_3=d_1+d_2$. Thus, the interval between adjacent word lines can be made smaller than the interval between adjacent outputs of the word drive circuits. Since $d_1$ is nearly equal to $d_2$, the interval between adjacent word lines can be reduced to about half the interval between adjacent outputs of the word drive circuit, i.e., half the width of a word drive unit.

Figure 7:
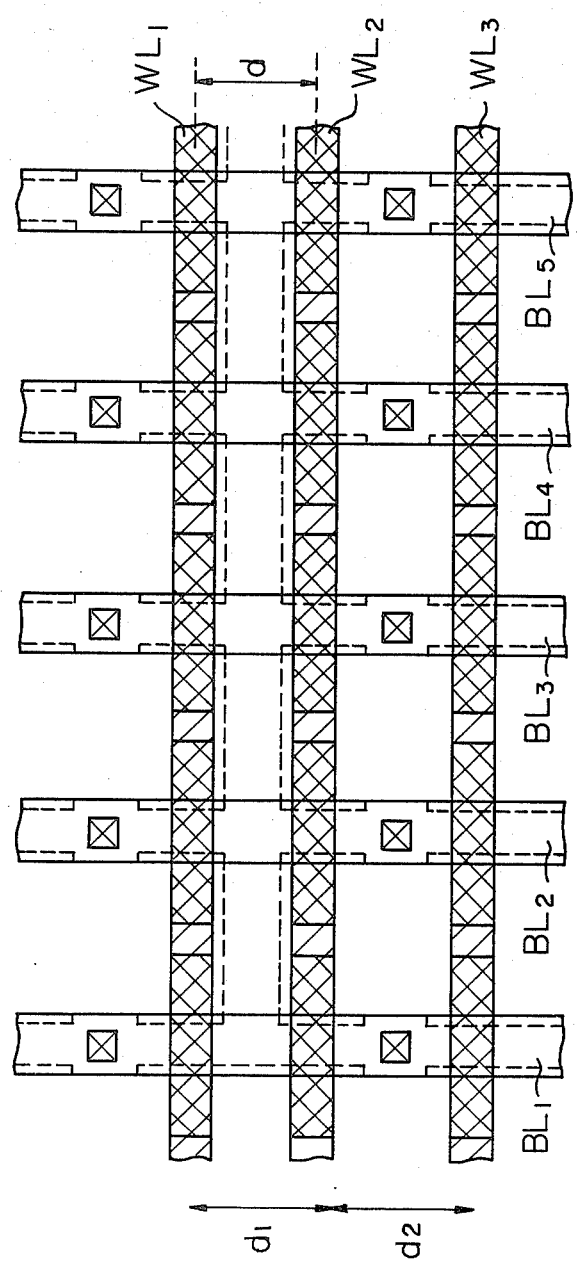
FIG. 7 is a plan view of a pattern arrangement in which adjacent word lines are not commonly connected to an output of a word drive circuit.

If, as in the conventional device, adjacent word lines are not commonly connected to an output of a word drive circuit, and if the interval between word lines could be made as small as in FIG. 4, i.e., $d_1$ or $d_2$, as illustrated in FIG. 7, then the interval between adjacent outputs of the word drive circuit, i.e., the width of a word drive unit would have to be the same as the interval $d_1$ or $d_2$. However, as mentioned before, it is difficult to miniaturize the word drive circuit because each drive unit has a very complex structure. Therefore, it is impossible to realize an interval between the adjacent outputs as short as $d_1$ or $d_2$ shown in FIG. 7 without increasing the amount of space required for the word drive circuits.

It will be seen that, in the embodiment illustrated in FIG. 3, in addition to the number of word lines, the number of bit lines is also twice that in the conventional device. This means that the interval between adjacent bit lines is half that in the conventional device when the size of the memory cell array $MCA_0$ in FIG. 3 is the same as that of the array MCA in FIG. 1. It is not difficult to make the interval between adjacent bit lines shorter than in the conventional devices.

In an EPROM decreasing the interval between adjacent bit lines is less difficult than in other types of memory devices. The size of the memory cell in the EPROM has, as illustrated in FIG. 4, a width x and a length y. Because the floating gate FG extends along the extending direction of the word line (control gate), the length y is greater than the width x. In the conventional devices, the interval between adjacent bit lines was greater than the length y of the memory cell, as can be seen from FIG. 7. In the embodiment, the memory cells connected to one word line are connected to alternate bit lines. Also, the column gate $CG_0$ connected to the bit lines does not have as complex a circuit structure as the word drive circuit. Therefore, it is easy to shorten the interval between adjacent bit lines.

In the embodiment of FIG. 3, the number of memory cells is twice that of the conventional example of FIG. 1. On the other hand, the number of memory cells connected to each bit line is the same as that in the conventional example of FIG. 1. Therefore, when the number of memory cells in a memory device of the present invention is made the same as that of the conventional device, the number of memory cells connected to each bit line in the embodiment of the present invention can be reduced to less than that in the conventional example of FIG. 1. As a result, with respect to a certain memory capacity, the capacitance of each bit line in this embodiment (the capacitance being derived from the diffusion regions of memory cells connected to the bit line) is reduced to less than the conventional example of FIG. 1. The reduction of the capacitance of each bit line results in an additional effect of high speed operation.

Figure 8:
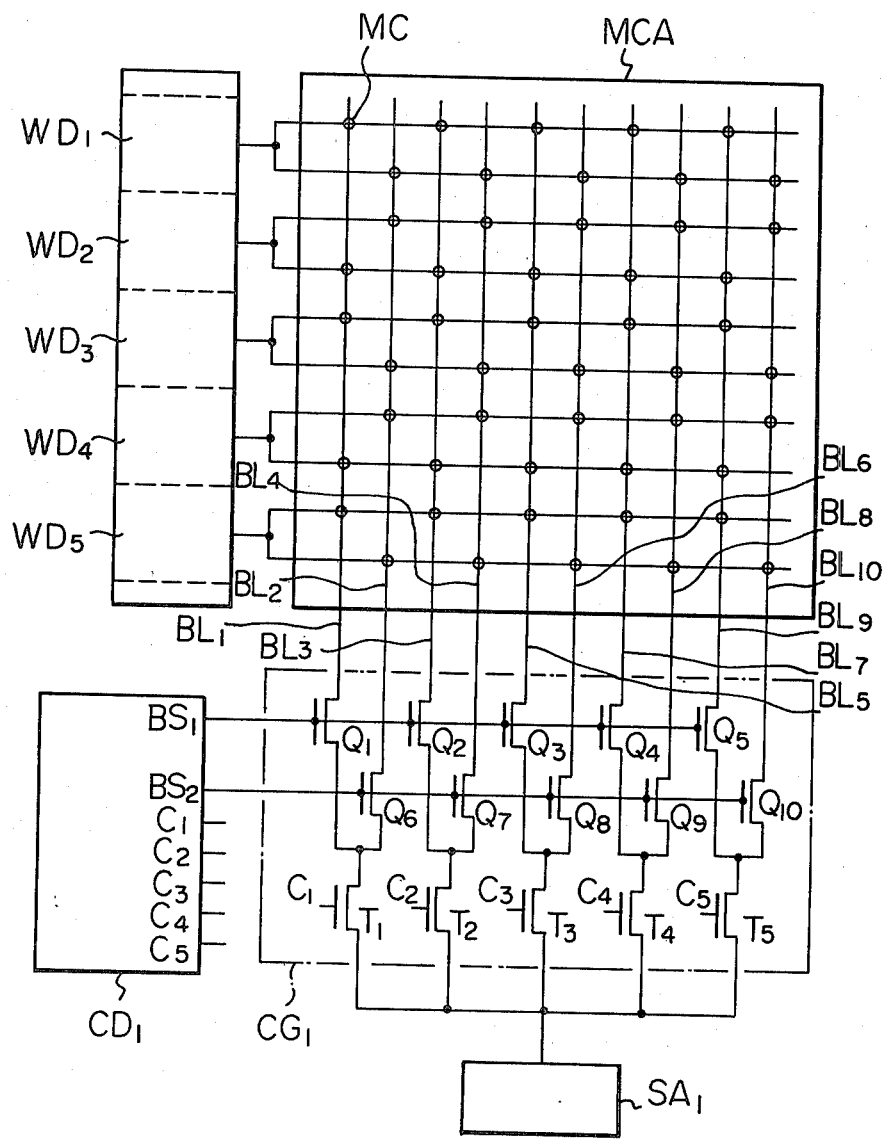
FIG. 8 is a block diagram of a semiconductor memory device, according to another embodiment of the present invention.

In the construction illustrated in FIG. 3, the number of the outputs $C_1$, $C_2$, . . . , and $C_{10}$ of the column decoder $CD_0$ is the same as the number of the bit lines $BL_1$, $BL_2$, . . . , and $BL_{10}$. The addition of a simple circuit in the column gate $CG_0$, however, can greatly reduce the number of the outputs of the column decoder. FIG. 8 is a block diagram illustrating another embodiment of the present invention, in which the number of the outputs of the column decoder is reduced. In FIG. 8, the column decoder $CD_1$ outputs seven signals, i.e., a first bit selection signal $BS_1$, a second bit selection signal $BS_2$, and the outputs $C_1$ through $C_5$. The column gate $CG_1$ comprises transistors $T_1$ through $T_5$, for respectively receiving the outputs $C_1$ through $C_5$, and transistors $Q_1$ through $Q_{10}$. The gates of the transistors $Q_1$ through $Q_5$ receive the first bit selection signal $BS_1$. The gates of the transistors $Q_6$ through $Q_{10}$ receive the second bit selection signal $BS_2$. The bit lines $BL_1$, $BL_3$, $BL_5$, $BL_7$, and $BL_9$ are respectively connected through the transistors $Q_1$, $Q_2$, $Q_3$, $Q_4$, and $Q_5$ to the transistors $T_1$, $T_2$, $T_3$, $T_4$, and $T_5$. The bit lines $BL_2$, $BL_4$, $BL_6$, $BL_8$, and $BL_{10}$ are respectively connected through the transistors $Q_6$, $Q_7$, $Q_8$, $Q_9$, and $Q_{10}$ to the transistors $T_1$, $T_2$, $T_3$, $T_4$, and $T_5$. The sources (or drains) of the transistors $T_1$, $T_2$, $T_3$, $T_4$, and $T_5$ are commonly connected to the input of the sense amplifier $SA_1$. The memory cell array $MCA_0$ and the word drive units $WD_1$ through $WD_5$ are the same as those in FIG. 3.

In the operation of the device of FIG. 8, when the first bit selection signal becomes the H level, the information on the bit lines $BL_1$, $BL_3$, $BL_5$, $BL_7$, and $BL_9$ is transferred to the transistors $T_1$ through $T_5$. When the second bit selection signal $BS_2$ becomes the H level, the information on the bit lines $BL_2$, $BL_4$, $BL_6$, $BL_8$, and $BL_{10}$ is transferred through the transistors $Q_6$, $Q_7$, $Q_8$, $Q_9$, and $Q_{10}$ to the transistors $T_1$ through $T_5$. According to the outputs $C_1$ through $C_5$ to the column decoder, a transistor, selected from the transistors $T_1$ through $T_5$, transfers the information from the selected bit line to the sense amplifier $SA_1$.

In the constitution of FIG. 8, although there are 10 bit lines, there are seven outputs of the column decoder $CD_1$. Generally, n bit lines can be selected by $(n/2+2)$ or $\{(n+1)/2+2\}$ outputs of the column decoder.

The present invention is not restricted to the above-described embodiments. Many other changes and modifications are possible without departing from the spirit of the invention.

For example, as an alternative to an EPROM erasable by means of ultraviolet rays, a mask read only memory (ROM) or a programmable read only memory (PROM) may be used for constituting a memory cell array. When a mask ROM or a PROM is used, the high voltage driving circuits $V_1$, $V_2$, . . . for effecting writing, included in the word drive circuit, are not necessary.

Also, instead of connecting two adjacent word lines to one output of a word drive circuit, a set including three or more adjacent word lines may alternatively be connected to one output of a word drive circuit.

From the foregoing description, it will be apparent that, according to the present invention, in a semiconductor memory device, a memory cell array can be miniaturized regardless of the fact that the word drive circuit cannot be miniaturized and without providing a further word drive circuit. Also, with respect to a certain memory capacity, the number of memory cells connected to one bit line is reduced in comparison with the prior art so that the capacitance of the bit line is reduced, resulting in a high speed operation.

I claim:

1. A semiconductor memory device comprising:
 a plurality of word lines;
 a plurality of bit lines intersecting said word lines;
 a word-line selecting and driving circuit having inputs operatively connected to receive word address signals, said word-line selecting and driving circuit decoding said word address signals and selectively driving said word lines;
 a bit-line selecting circuit having inputs operatively connected to receive bit address signals, said bit-line selecting circuit decoding said bit address signals and selecting one of said bit lines; and
 a plurality of memory cells respectively arranged at the intersections between said word lines and said bit lines;
 said word-line selecting and driving circuit having outputs, each of which is commonly connected to a respective one of a plurality of sets of plural adjacent word lines;
 said memory cells being arranged only at the intersections between one of the adjacent word lines in each one of said sets and one of said bit lines, and between another of the adjacent word lines in said each one of said sets and another of said bit lines.

2. A semiconductor memory device as set forth in claim 1, wherein the distance between adjacent bit lines defines an interval, each of said memory cells has a length in the direction substantially perpendicular to said bit lines, and said interval is shorter than the length of the memory cell in the word line extending direction.

3. A semiconductor memory device as set forth in claim 2, wherein, in each set of said plural adjacent word lines, said memory cells are arranged in such a manner that a first memory cell is arranged at the intersection between a first word line and a first bit line; a second memory cell is arranged at the intersection between a second word line adjacent to said first word line and a second bit line adjacent to said first bit line; a third memory cell is arranged at the intersection between a third word line adjacent to said second word line and a third bit line adjacent to said second bit line; and wherein said memory cells are arranged with associated word and bit lines in corresponding succession.

4. A semiconductor memory device as set forth in claim 3, wherein said bit-line selecting circuit comprises a column decoder for decoding said bit address signals and a column gate for selecting one of said bit lines to connect said selected bit line to a sense amplifier, said column decoder being adapted to output a bit-line selecting signal, said column gate comprising a plurality of groups of transfer gates connected to said bit lines in a one-to-one correspondence, and a plurality of bit-line selecting transistors connected to each group of transfer gates, said transfer gates in each group of transfer gates being adapted to simultaneously transfer information on the bit lines connected to said group of transfer gates when said group of transfer gates receives said bit-line selecting signal, and said column decoder being adapted to output a decoder signal so as to select one of said bit-line selecting transistors to transfer information from said transfer gate connected to the selected bit-line selecting transistor to said sense amplifier.

5. A semiconductor memory device as set forth in claim 3 or 4, wherein each set of plural adjacent word lines is commonly connected to one output of said word-line selecting and driving circuit.

6. A semiconductor memory device as set forth in claim 5, wherein said semiconductor memory device is an EPROM, and said memory cells are FAMOS memory cells.

7. A semiconductor memory device as set forth in claim 5, wherein said semiconductor memory device is a mask ROM.

8. A semiconductor memory device as set forth in claim 5, wherein said semiconductor memory device is a PROM.

9. A semiconductor memory device as set forth in claim 1, 2, 3 or 4, wherein said semiconductor memory device is an EPROM, and said memory cells are FAMOS memory cells.

10. A semiconductor memory device as set forth in claim 1, 2, 3 or 4, wherein said semiconductor memory device is a mask ROM.

11. A semiconductor memory device as set forth in claim 1, 2, 3 or 4, wherein said semiconductor memory device is a PROM.

12. A semiconductor memory device operatively connected to receive word address signals and bit address signals, comprising:

a plurality of word lines having a word line extending direction, said word lines being connected in sets of plural adjacent word lines;

a plurality of bit lines intersecting said word lines and having a bit line extending direction;

a plurality of memory cells arranged at the intersections of said word lines and said bit lines such that for each bit line a memory cell is formed at the intersection of the bit line with only one of said word lines in each group of plural adjacent word lines, said memory cells having a length in the word line extending direction and a width in the bit line extending direction;

a word line selecting and driving circuit having inputs operatively connected to receive the word address signals, and outputs, each set of plural adjacent word lines being commonly connected to a respective one of said outputs, said word line selecting and driving circuit decoding the word address signals and selectively driving said word lines; and a bit line selecting circuit having inputs operatively connected to receive the bit address signals, said bit line selecting circuit decoding the bit address signals and selecting one of said bit lines.

13. A semiconductor memory device according to claim 12, wherein the distance between adjacent bit lines defines an interval and said interval is shorter than the length of the memory cell in the word line extending direction.

14. A semiconductor memory device according to claim 12, wherein:

said bit-line selecting circuit comprises a column decoder for decoding the bit address signals and a column gate for selecting one of said bit lines to connect said selected bit line to a sense amplifier;

said column decoder is adapted to output a bit-line selecting signal;

said column gate comprises a plurality of groups of transfer gates respectively connected to said bit lines and a plurality of bit-line selecting transistors respectively connected to said groups of transfer gates;

said transfer gates in each group of transfer gates are adapted to simultaneously transfer information on the bit lines connected to said group of transfer gates when said group of transfer gates receives the bit-line selecting signal; and said column decoder is adapted to output a decoder signal so as to select one of said bit-line selecting transistors to transfer information from said transfer gate connected to the selected bit-line selecting transistor, to said sense amplifier.

* * * * *

UNITED STATES PATENT AND TRADEMARK OFFICE
CERTIFICATE OF CORRECTION

PATENT NO. : 4,481,609
DATED : November 6, 1984
INVENTOR(S) : Higuchi et al.

It is certified that error appears in the above-identified patent and that said Letters Patent is hereby corrected as shown below:

Col. 3, line 10, delete "for";

line 64, "$C_{101}$" should be --$C_{10}$--; "to be a high potential. The" [change print style/size];

line 65, "selected one of the outputs $C_1$" [change print style/size].

Col. 4, line 16, "a" should be --as--;

line 24, after "the" insert --word--;

line 29, "or" (1st occurr) should be --of--;

line 34, delete ";";

line 49, delete "$V_{pp}$".

Signed and Sealed this

Twenty-fifth Day of June 1985

[SEAL]

Attest:

DONALD J. QUIGG

Attesting Officer     Acting Commissioner of Patents and Trademarks